United States Patent
Beaussart et al.

(10) Patent No.: US 6,429,504 B1
(45) Date of Patent: Aug. 6, 2002

(54) MULTILAYER SPIRAL INDUCTOR AND INTEGRATED CIRCUITS INCORPORATING THE SAME

(75) Inventors: Stephane Beaussart, Nashua, NH (US); Wayne Mack Struble, Franklin, MA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/571,909

(22) Filed: May 16, 2000

(51) Int. Cl.$^7$ ............................................. H01L 29/00
(52) U.S. Cl. ........................................ 257/531; 257/516
(58) Field of Search ................................ 257/531, 516

(56) References Cited

U.S. PATENT DOCUMENTS

| | | | | |
|---|---|---|---|---|
| 5,446,311 A | * | 8/1995 | Ewen et al. ................ | 257/531 |
| 5,559,360 A | * | 9/1996 | Chiu et al. .................. | 257/531 |
| 5,610,433 A | * | 3/1997 | Merrill et al. ............... | 257/531 |
| 5,656,849 A | * | 8/1997 | Burghartz et al. ........... | 257/528 |
| 5,874,883 A | | 2/1999 | Uemura et al. .............. | 336/200 |
| 5,936,298 A | * | 8/1999 | Capocelli et al. ............ | 257/531 |
| 6,002,161 A | * | 12/1999 | Yamazaki .................... | 257/531 |
| 6,037,649 A | * | 3/2000 | Liou ........................... | 257/531 |

FOREIGN PATENT DOCUMENTS

JP          5-82736     *  4/1993   ............... 257/531

\* cited by examiner

*Primary Examiner*—Ngan V. Ngo

(57) ABSTRACT

A multiple layer inductor structure in which the difference in phase current between upper and lower spiral inductor segments is reduced so as to thereby obtain not only a significant reduction in area but also a substantial increase in self-resonance frequency and a concomitant increase in the operating frequency range. The structure incorporates upper and lower spiral inductor sections, the lower section being disposed on the surface of a semiconductor substrate and the upper section being disposed on the surface of a dielectric layer which separates the respective spiral inductor sections. A plurality of electrically conductive vias interconnect adjacent concentric loop segments of the spiral inductor sections, so that as current flows through the inductor element it passes from one of the upper and the lower inductor sections to the other of the upper and lower inductor sections, alternating between these levels a number of times (i.e., a number less than or equal to the number of concentric segments). Because current flows in the same direction in each of the upper and lower inductor sections, the mutual inductance between the upper and lower inductor sections has a net positive effect on the total value of inductance of the structure, rather than a negative effect.

16 Claims, 4 Drawing Sheets

2

MULTILAYER SPIRAL INDUCTOR AND INTEGRATED CIRCUITS INCORPORATING THE SAME

BACKGROUND OF THE INVENTION

1. Field of the Invention

The present invention relates to an inductive element or inductor and more particularly, to an inductor structure formed on an insulating substructure and circuits incorporating such a structure.

2. Discussion of the Background Art

Planar-type inductors formed over a semiconductor substrate are frequently employed in integrated circuits designed for the millimeter and radio frequency band. As shown in FIG. 1, a planar-type inductor structure (8) typically has a spiral configuration which includes a ribbon or spiral of conductive metal (10) formed over a semiconductor substrate (12) through an insulating layer 14 on the substrate. The inductance value of the conventional square shaped inductor shown in FIG. 1 can be expressed as the following equation:

$$L = \frac{0.27(d)^{8/3}}{p^{5/3}(1+1/r)^{5/3}} \quad (1)$$

Where L is the inductance (nH), d is a length (mm) of the most outer dimension of the spiral shaped inductor metalization layer (10), p is a width (mm) of the spiral-shaped inductor metalization layer 10, q is the spacing (mm) between two neighboring regions of the spiral-shaped metalization layer 10, and r is ratio of p/q, i.e. (p/q). When p=q, the above equation is simplified to the following equation:

$$L = \frac{0.085(d)^{8/3}}{p^{5/3}} \quad (2)$$

For example, if p=q=0.05 mm and d=0.5 mm, the inductance L is calculated from the above equation (1) or (2) as approximately 2 nH.

A principal advantage of the planar inductor construction described above is that it increases the level of integration for the circuit by reducing the number of circuit elements located off the chip along with attendant need for complex interconnections. Recently, however, to decrease the size and fabrication cost of semiconductor integrated circuit devices, not only active components (e.g., transistors) but also passive components (e.g., inductors and capacitors) have been required to be miniaturized more and more. The need for miniaturization in such devices as the inductor, however, has not relaxed the requirement to deliver the same or even higher values of inductance. Accordingly, for the above planar-type inductors, attempts have been made to address the miniaturization requirement by decreasing the size of the spiral-shaped conductor layer 10. That is, by reducing the size of the width p and the interval q.

For example, if p=0.006 mm, q=0.006 mm and d=0.15 mm, the inductance L is calculated from the above equation (1) to be approximately 2.5 nH. If the spiral-shaped metalization layer or conductor 10 having this dimension is formed on a GaAs substrate, the inter-line capacitance C of the conductor 10 is equal to approximately 0.06 pF. This value is obtained by an approximation of regarding the two neighboring regions of the spiral-shaped conductor (10) as coplanar strip lines. The resonance frequency $f_o$ in this case is approximately equal to 12.5 GHz, where $f_o$ is defined as the following equation (3):

$$f_o = 1/[2\pi(LC)^{1/2}] \quad (3)$$

To reduce the plan size of the spiral-shaped inductor metalization or conductor 10 to, say, 70% of its original size, if the above parameters are designed as p=0.0024 mm and q=0.001 mm, the inductance L can be maintained at approximately 2.5 nH. However, the inter-line capacitance C of the conductor 10 increases up to approximately 0.28 pF and, as a result, the resonance frequency $f_o$ will decrease to approximately 6.0 GHz, which is lower than the case of the original size by approximately 6.5 GHz. Accordingly, with the conventional inductor shown in FIG. 1, when the interval q of the neighboring regions of the spiral-shaped conductor 10 is decreased for miniaturization, the inter-line capacitance C will increase and the resonance frequency $f_o$ will decrease and, consequently, the maximum operable frequency is lowered.

In recognition of the practical constraints imposed on the maximum value of inductance which can be realized by a conventional planar inductor of the type shown in FIG. 1, it has been proposed to fabricate a multi-layer inductor component. One known multilayer inductor configuration is illustrated in FIG. 2. As seen in FIG. 2, the multilayer inductor structure 20 is fabricated with first and second levels of metalization constituting respective spiral inductor sections 22 and 24. Each of inductor sections 22 and 24 is formed on a corresponding insulating layer, designated generally at 26 and 28, respectively, and are connected end to end by a centrally locating conductive via 30. In comparison to the planar structure depicted in FIG. 1, the multilayer arrangement of FIG. 2 does provide a substantial increase in inductance per unit area, as well as a reduction in the dimension d.

Disadvantageously, however, employment of an end to end manner of interconnection in the structure of FIG. 2 means that the overall capacitance (end to end) has a negative effect on the self-resonance frequency. As such, the operating frequency range is still too limited for many new applications. In the exemplary prior art structure depicted in FIG. 2, where p=0.006 mm and q=0.006 mm and the overall dimension d was 0.105 mm, an inductance of 2.5 nH was obtained with a resonant frequency $f_o$ of 3.8 GHz and an inter-line capacitance of 0.046 pF.

Accordingly, there exists a need to provide an inductor arrangement for use in integrated circuits which is not only substantially more compact but which also operates at a substantially higher frequency than has heretofore been possible practicable.

SUMMARY OF THE INVENTION

The aforementioned need is addressed, and an advance is made in the art, by a multiple layer inductor structure in which the difference in phase current between upper and lower spiral inductor segments is reduced so as to thereby obtain not only a significant reduction in area but also a substantial increase in self-resonance frequency. In accordance with an illustrative embodiment of the present invention, the structure incorporates upper and lower spiral inductor sections—the lower section being disposed on the surface of a semiconductor substrate and the upper section being disposed on the surface of a dielectric layer which separates the respective spiral inductor sections.

A plurality of electrically conductive links or vias interconnect adjacent concentric segments of the spiral inductor sections. Accordingly, as current flows through the inductor element it passes from one of the upper and the lower inductor sections to the other of the upper and lower inductor sections, alternating between these levels a number of times (i.e., a number less than or equal to the number of concentric segments). Because current flows in the same direction in each of the upper and lower inductor sections, rather than in opposite directions, the mutual inductance between the upper and lower inductor sections has a net positive effect on the total value of inductance of the structure, rather than a negative effect.

BRIEF DESCRIPTION OF THE DRAWINGS

The present invention will be better understood by reference to the detailed description which follows, taken with the accompanying drawings, in which.

DETAILED DESCRIPTION OF THE INVENTION

Figure 3:
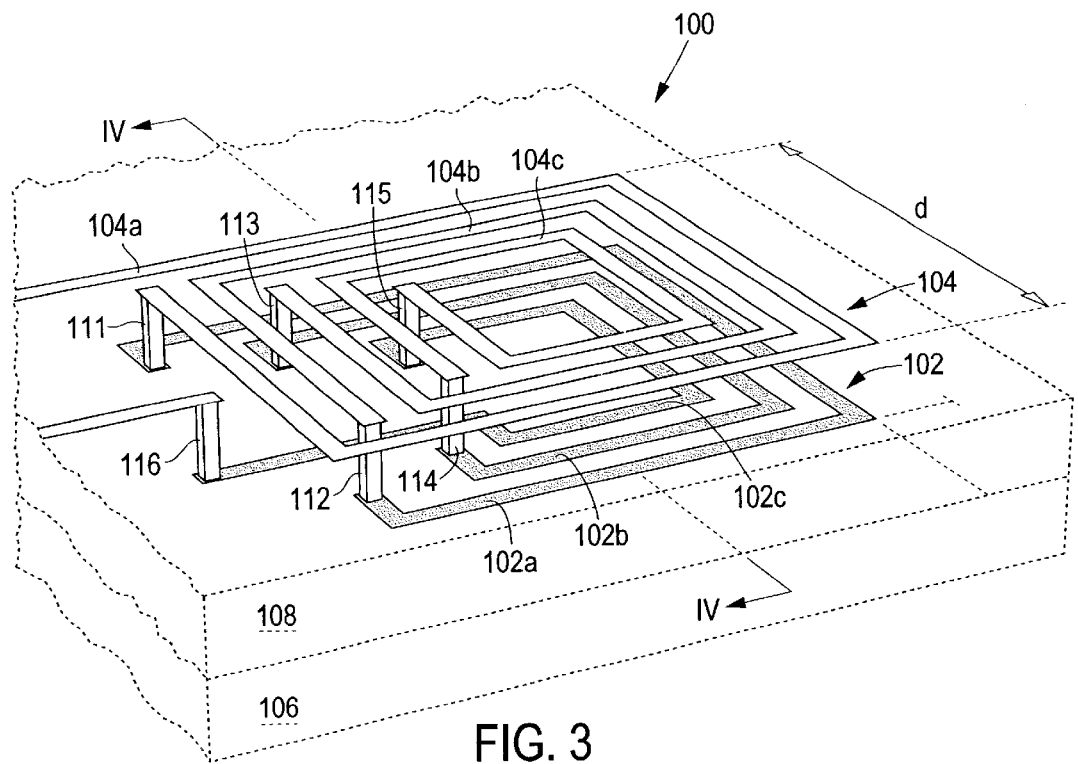
FIG. 3 is a perspective view of a multilayer inductor structure constructed in accordance with an illustrative embodiment of the present invention.
Figure 4:
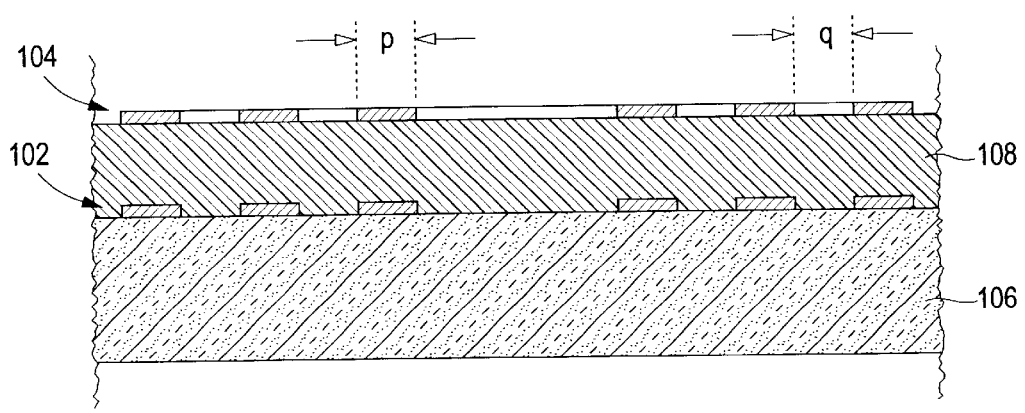
FIG. 4 is a cross sectional view of the illustrative embodiment of the present invention depicted in FIG. 3, along line IV—IV in FIG. 3 and FIGS. 5A–5H depict an illustrative sequence of processing steps which may be employed to obtain a multiple layer inductor structure in accordance with the present invention.

A multilayer inductor according to an illustrative embodiment of the present invention is shown in FIGS. 3 and 4. Initially, it should be noted that although only two layers are shown in the exemplary structure depicted in FIGS. 3 and 4, it is contemplated by the inventors herein that one or more additional layers may be provided so as to accommodate a corresponding number of patterned metallization layers—with each such layer defining a respective inductor element section. In any event, and with particular reference to FIG. 3, it will be seen that inductor element 100 comprises lower and upper patterned metalization layers generally indicated at 102 and 104, respectively. In the illustrative embodiment depicted in FIGS. 3 and 4, lower patterned metalization layer 102 is disposed on the upper surface of a semiconductor substrate 106. For integrated circuits designed for high-frequency applications (e.g., on the order of 1 GHz or more), underlying substrate 106 will typically be comprised of a material such as silicon (Si) or gallium arsenide (GaAs). In the illustrative example depicted in FIGS. 3 and 4, a 10 mil thick substrate of GaAs is deemed to provide a suitable surface on which to develop a monolithic microwave integrated circuit incorporating, in accordance with the teachings of the present invention, an inductor element having a typical inductance of about 2.5 nH.

Upper and lower metalization layers 102 and 104 each comprise a plurality of concentric loop segments, these being indicated generally at 102a, 102b, 102c and 104a, 104b, and 104c, respectively. It will, of course, be readily appreciated by those skilled in the art that the precise geometric shape of metalization layers 102 and 104, as well as the overall length dimension L, the number of concentric inductor sections or loop segments, the width p of each loop segment, and the spacing q between adjacent loop segments, are selected in accordance with the portion of a desired inductance value to be contributed by each respective metalization layer. Although the illustrative embodiment depicted in FIG. 3 shows an equal number of loop segments in each of metalization layers 102 and 104, it should be noted that this need not be the case.

In any event, and with reference now to FIG. 4, it will be seen that a dielectric layer 108 covers lower metallization 102 and is therefore interposed between metallization layers 102 and 104. As will be readily appreciated by those skilled in the art, the thickness of dielectric layer 108 will be selected on the basis of the inter-line capacitance between upper and lower loop segments as, for example loop segments 102a and 104a, and may be comprised of any suitable material such, for example, as silicon dioxide ($SiO_2$), alumina ($Al_2O_3$), or Benzo Cyclo Butane (BCB). In the embodiment shown in FIGS. 3 and 4, a 0.03 (0.75 um) mil thick layer of $SiO_2$—which layer has a dielectric constant of about 3.9—was employed.

Figure 5A:
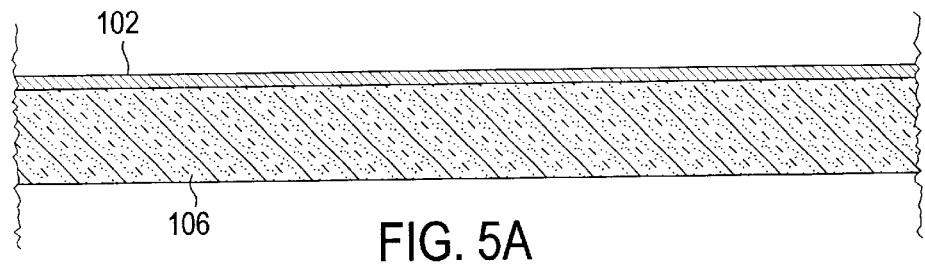
Figure 5B:
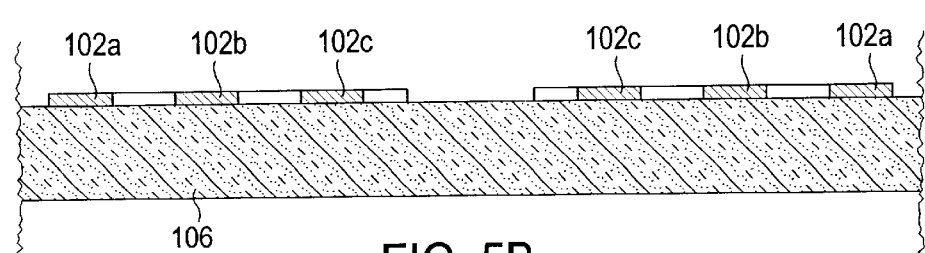
Figure 5C:
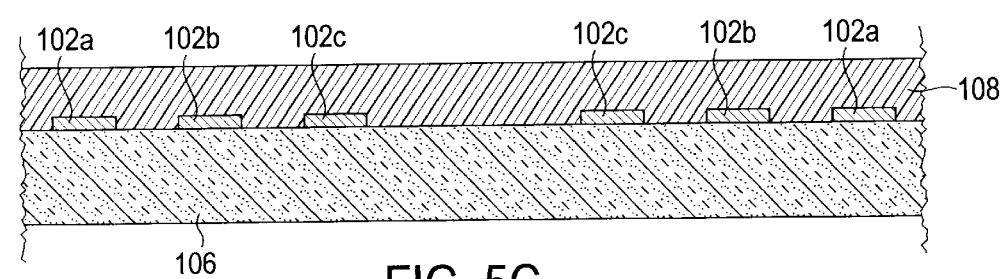

In accordance with a novel aspect of the present invention, conductive links 111–116 (FIG. 3) are defined in dielectric layer 108 to accommodate electrically conductive interconnections between respective loop segments of the lower metalization layer and corresponding loop segments of the upper metalization layer. These interconnections may, for example, be realized by the formation of conductive vias through the implementation of conventional photolithographic and metal deposition processes. By way of illustrative example, the embodiment depicted in FIGS. 3 and 4, was formed according to the following process sequence:

As shown in FIG. 5A, the lower metalization layer 102 is formed on the chief surface of substrate 106 by an evaporation or sputtering technique. The layer 102 is then patterned to form a linear spiral shape consisting of linear loop sections 102a, 102b and 102c by conventional photolithographic and dry etching techniques, to obtain the arrangement seen in FIG. 5B. Dielectric layer 108 is then formed on the exposed chief surface of the substrate 106 to cover the linear loop sections 102a, 102b and 102c by a plasma-enhanced chemical vapor deposition (CVD) technique or the like. The thickness of dielectric layer 108 is 0.75 $\mu$m. The surface of dielectric layer 108 is then planarized by a spin on glass (SOG) or selective etching technique using a masking photoresist film to obtain the intermediate structure shown in FIG. 5C.

Figure 5D:
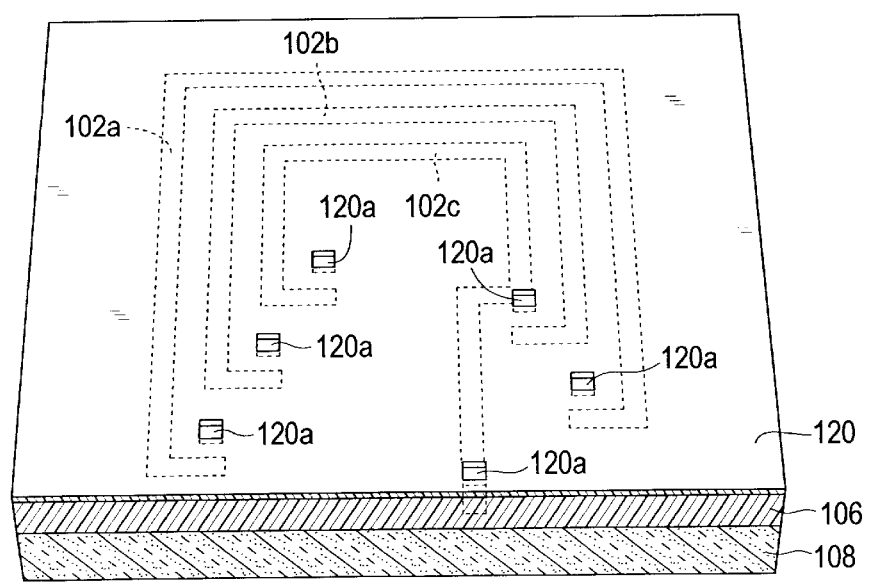
Figure 5E:
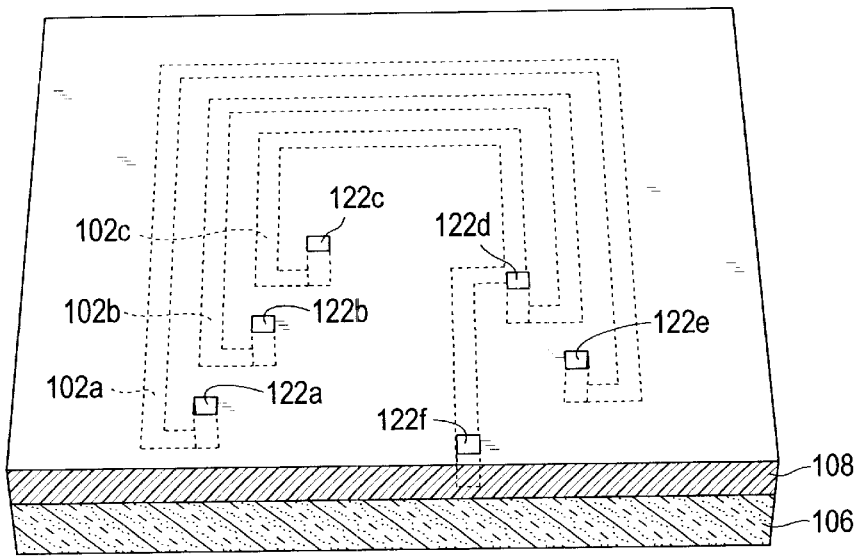

Subsequently, as shown in FIG. 5D, a patterned photoresist film 120 is formed on dielectric layer 108 by a conventional photolithographic technique. The film 120 has windows 120a for the contact holes 122a–122f. Using the patterned photoresist film 120 as a mask, dielectric layer 108 is selectively etched by a suitable etchant to thereby form contact holes 122a–122f, as shown in FIG. 5E. At this stage, the ends of each loop segment (e.g., 102a, 102b and 102c) of lower metalization layer 102 are partially exposed from dielectric layer 108 through contact holes 122a–122f. The film 120 is then removed.

Figure 5F:
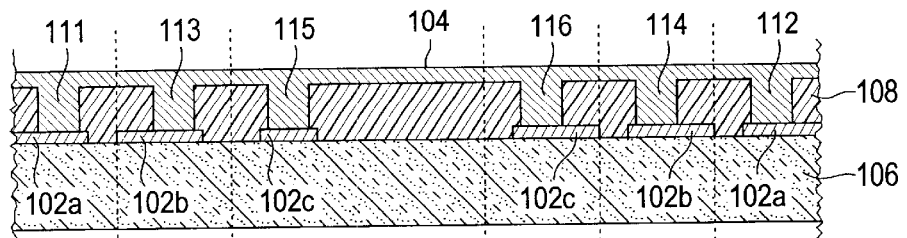
Figure 5G:
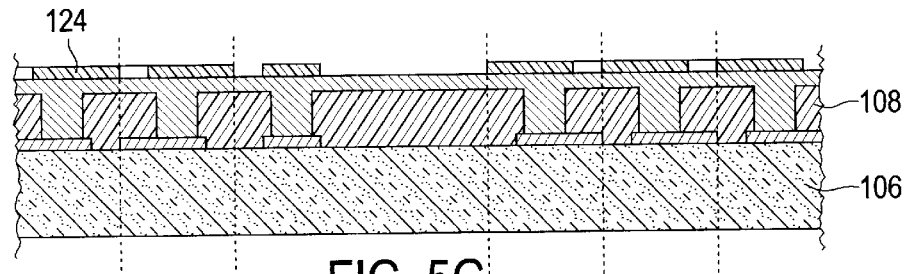
Figure 5H:
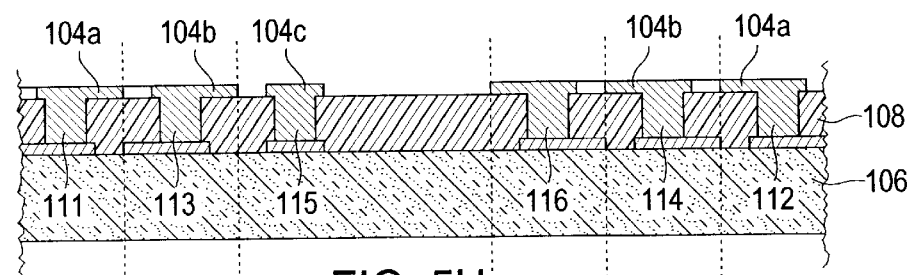

Further, as shown in FIG. 5F, upper metalization layer 104 is selectively formed on dielectric layer 108 by a popular evaporation or sputtering technique. During this metalization step, the contact holes 122a–122f are filled with deposited metal thereby forming electrically conductive links 111–116 which will ultimately interconnect the respective loop segments of the upper and lower metalization layers. A patterned photoresist film 124 is formed on upper metalization layer 104 by a conventional photolithographic technique (FIG. 5G). The film 124 has windows for removing, by a suitable etchant, all deposited metal except that constituting the individual loop segments (e.g., 104a, 104b and 104c) and the conductive links 111–116 interconnecting them to those of the lower metalization layer 102. Using the patterned photoresist film 124 as a mask, the excess metal is removed, and then the photoresist film 124 is removed to obtain the completed structure depicted in FIGS. 3 and 5H.

Figure 1:
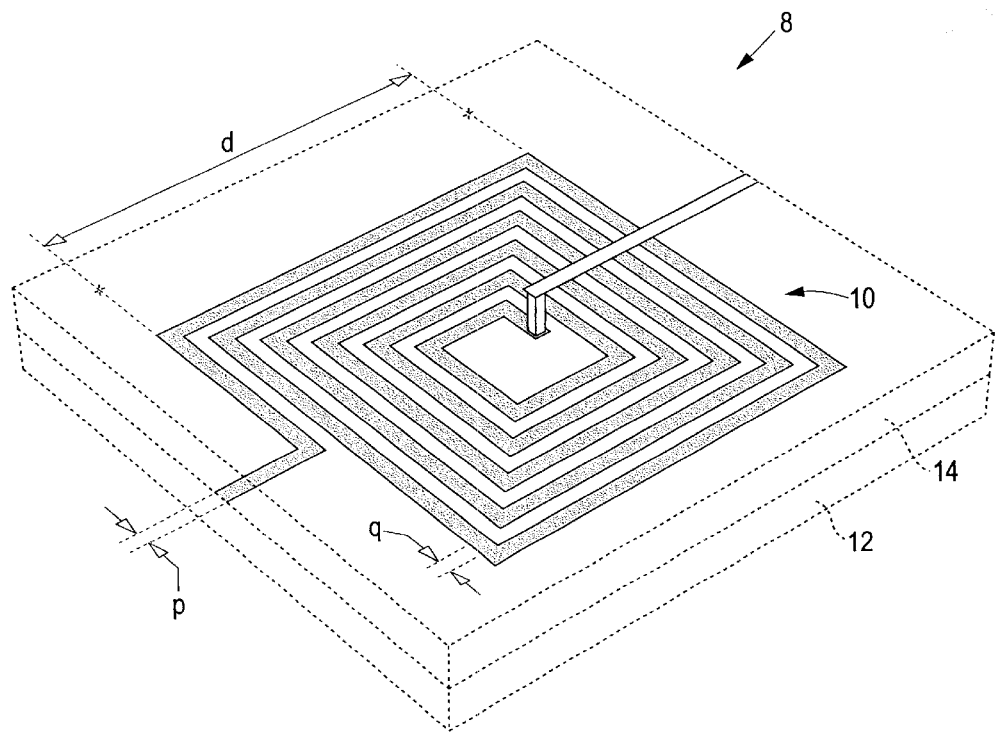
FIG. 1 is a perspective view of a conventional planar-type inductor.
Figure 2:
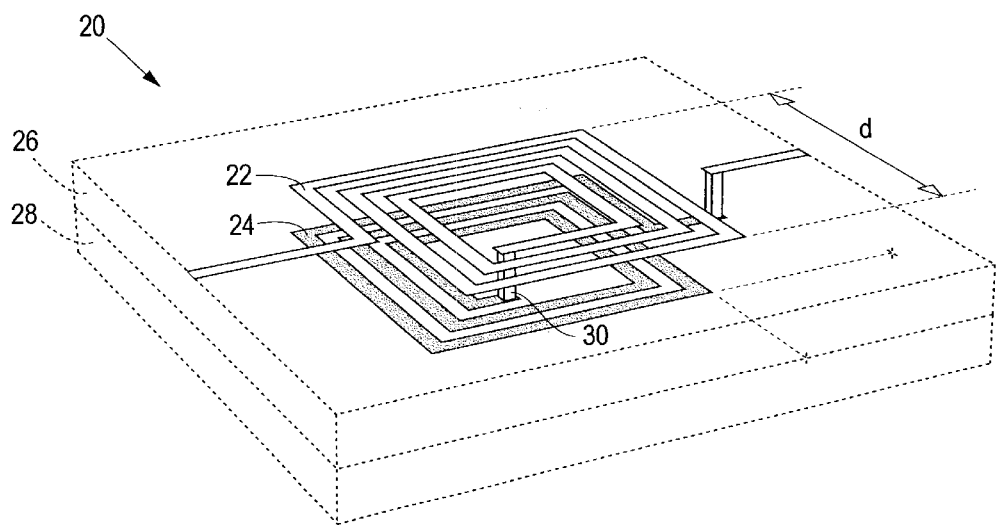
FIG. 2 is a perspective view of a conventional multilayer inductor.

In accordance with the present invention, it is possible to obtain, for a given value of impedance, a substantially more compact structure than a conventional single-layer inductor structure while also obtaining a high resonant frequency. Additionally, as compared to a 2.5 nH conventional multi-layer structure (e.g., the configuration of FIG. 2) of equal overall width d of 0.105 mm, a inter-line spacing in each metalization layer of 0.006 mm, and a line width of 0.006 mm, a multlayer inductor structure of the same inductance value constructed in accordance with the present invention achieved a resonant frequency $f_o$ of 9.6 GHz and a capacitance of 0.0741 pF versus values of 3.8 GHz and 0.046 pF, respectively, in the conventional structure.

While certain illustrative forms of the present invention have been illustrated and described in detail, it is to be understood that modifications will be apparent to those skilled in the art without departing from the spirit of the invention. The scope of the invention, therefore, is to be determined solely by the appended claims.

What is claimed is:

1. A multiple layer inductor comprising;
   a substrate of semiconductor material;
   a first patterned conductor layer having a predesigned geometric shape and being formed on a surface of said substrate of semiconductor material, said first patterned conductor layer including a first loop defining a first end and a second end and being dimensioned and arranged to provide a first portion of a desired inductance value;
   a layer of insulating material disposed over said first patterned conductor layer; and
   a second patterned conductor layer having a predesigned geometric shape and being formed on a surface of said layer of insulating material, said second patterned conductor layer including a first loop defining a first end and a second end and being dimensioned and arranged to provide a second portion of a desired inductance value;
   wherein a first end of the first loop of said first patterned conductor layer is interconnected to a first end of the first loop of said second patterned conductor layer by a conductive link extending through said layer of insulating material, and
   wherein at least one of said first and second patterned conductor layers further includes a second loop having a first end and a second end and being dimensioned and arranged to provide a third portion of a desired inductance value, a first end of said second loop being interconnected to a second end of one of said first loops by a conductive link extending through said layer of insulating material.

2. The multiple layer inductor of claim 1, wherein said semiconductor material is one of GaAs and Si, InP, SiC, GaN.

3. The multiple layer inductor of claim 1, wherein said first and second patterned conductor layers each comprise a plurality of concentric loops, with each loop of a patterned conductor layer being connected to at least one loop of the other patterned conductor layer by a respective conductive link extending through said layer of insulating material.

4. The multiple layer inductor of claim 1, wherein said layer of insulating material comprises silicon dioxide and Benzo Cyclo Butane (BCB).

5. The multiple layer inductor of claim 1, wherein a second end of another of said first loops is dimensioned and arranged for electrical connection to an external circuit located outside said multiple layer inductor.

6. The multiple layer inductor of claim 1, wherein a second end of said second loop is dimensioned and arranged for electrical connection to an external circuit located outside said multiple layer inductor.

7. The multiple layer inductor of claim 1, further including
   a second layer of insulating material disposed over said second patterned conductor layer; and
   a third patterned conductor layer having a predesigned geometric shape and being formed on a surface of said second layer of insulating material, said second patterned conductor layer being dimensioned and arranged to provide a fourth portion of a desired inductance value.

8. A multiple layer inductor comprising;
   a substrate of semiconductor material;
   a first patterned conductor layer having a predesigned geometric shape and formed as a spiral on a surface of said substrate of semiconductor material, said spiral being dimensioned and arranged to provide a first portion of a desired inductance value;
   a layer of insulating material disposed over said first patterned conductor layer; and
   a second patterned conductor layer having a predesigned geometric shape and formed as a spiral on a surface of said layer of insulating material, said spiral being dimensioned and arranged to provide a second portion of a desired inductance value;
   wherein said first and second patterned conductor layers are electrically interconnected by a plurality of conductive links extending through said layer of insulating material.

9. The multiple layer inductor of claim 7, wherein said semiconductor material is one of GaAs and Si.

10. The multiple layer inductor of claim 7, wherein said layer of insulating material comprises silicon dioxide.

11. The multiple layer inductor of claim 7, further including
    a second layer of insulating material disposed over said second patterned conductor layer; and
    a third patterned conductor layer having a predesigned geometric shape and being formed on a surface of said second layer of insulating material, said second patterned conductor layer being dimensioned and arranged to provide a fourth portion of a desired inductance value, wherein said third patterned conductor layer is electrically interconnected to at least one of said first and second patterned conductor layers by a plurality of conductive links extending through said second layer of insulating material.

12. A multiple layer inductor comprising;
    a substrate of semiconductor material;
    a first patterned conductor layer having a predesigned geometric shape and being formed on a surface of said substrate of semiconductor material, said first patterned conductor layer being dimensioned and arranged to provide a first portion of a desired inductance value;
    a layer of insulating material disposed over said first patterned conductor layer; and a second patterned conductor layer having a predesigned geometric shape and being formed on a surface of said layer of insulating material, said second patterned conductor layer being dimensioned and arranged to provide a second portion of a desired inductance value;

wherein said first and second patterned conductor layers each comprise a plurality of concentric loops, with each loop of a patterned conductor layer being connected to at least one loop of the other patterned conductor layer by a respective conductive link extending through said layer of insulating material.

13. A microwave integrated circuit comprising:

a multiple layer inductor including a substrate of semiconductor material having formed thereon a first patterned conductor layer, said first patterned conductor layer being dimensioned and arranged to provide a first portion of a desired inductance value; and a layer of insulating material disposed over said first patterned conductor layer and having a second patterned conductor layer formed thereon, said second patterned conductor layer being dimensioned and arranged to provide a second portion of a desired inductance value;

wherein said first and second patterned conductor layers each comprise a plurality of concentric loops, with each loop of a patterned conductor layer being connected to at least one loop of the other patterned conductor layer by a respective conductive link extending through said layer of insulating material; and an active device.

14. The microwave integrated circuit of claim 11, wherein said active device is a field effect transistor.

15. The microwave integrated circuit of claim 11, wherein said substrate of semiconductor material comprises one of GaAs and Si.

16. The microwave integrated circuit of claim 11, wherein said layer of insulating material is silicon dioxide.

* * * * *